(12) United States Patent
Hirano

(10) Patent No.: US 6,256,228 B1
(45) Date of Patent: Jul. 3, 2001

(54) METHOD FOR ERASING NONVOLATILE SEMICONDUCTOR STORAGE DEVICE CAPABLE OF PREVENTING ERRONEOUS READING

(75) Inventor: Yasuaki Hirano, Yamatokooriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/590,378

(22) Filed: Jun. 9, 2000

(30) Foreign Application Priority Data

Oct. 6, 1999 (JP) .................................................. 11-163814

(51) Int. Cl.$^7$ .................................................. G11C 16/04
(52) U.S. Cl. .................................. 365/185.11; 365/185.29
(58) Field of Search .......................... 365/185.11, 185.17, 365/185.18, 185.29, 185.33

(56) References Cited

U.S. PATENT DOCUMENTS 5,784,325 * 7/1998 Tulip ................................ 365/185.18
5,822,248 * 10/1998 Satori et al. ..................... 365/185.11
6,122,196 * 9/2000 Tanaka et al. ................... 365/185.11

FOREIGN PATENT DOCUMENTS 10-092958 * 4/1998 (JP) .

OTHER PUBLICATIONS

""AND" cell structure for a 3V–only 64Mbit flash Memory",The Institute of Electronics, Information and Communication Engineers Technical Report, ICD93–128, pp. 37–43, 1993.*

"A Novel Cell Structure Suitable for a 3 Volt Operation, Sector Erase Flash memory", the Institute of Electronics, Information and Communication Engineers Technical Report, ICD 93–26, pp. 15–20, 1993.*

"a Novel Dual String NOR (DuSNOR) Memory Cell Technology Scalable to the 256 Mbit and 1 Gbit Flash Memories", IEDM Technical Digest, pp. 263–266, 1995.*

"A New Cell Structure for Sub–quarter Micron High Density Flash Memory", IEDM Technical Digest, pp. 267–270, 1995.*

"A sensing scheme for a ACT flash memory",The Institute or Electronics, Information and Communication Engineers Technical Report, ICD 97–21, pp. 37–42, 1997.*

\* cited by examiner

Primary Examiner—Trong Phan
(74) Attorney, Agent, or Firm—Morrison & Foerster LLP

(57) ABSTRACT

A nonvolatile semiconductor storage device erasing method prevents an erroneous reading by suppressing a threshold voltage change of a memory cell due to substrate disturbance in an erase operation of the memory cell. In the erase operation of a selected block, a first positive voltage of +3 V is applied to word lines of an unselected block, and a reference voltage of 0 V is applied to odd-number sub-bit lines. Even-number sub-bit lines are brought into a floating state. Since the first positive voltage of 13 V is applied to a control gate through the word line, the memory cell in a low state of threshold voltage such as about 1.5 V is turned on. Thus, the turned-on memory cell forms a channel layer, which has the reference voltage of 0 V. Then, a potential difference between the control gate and the channel layer is reduced to a small value of 3V so that an electric field between a floating gate and the channel layer is decreased. Thereby, the substrate disturbance is alleviated to prevent the erroneous reading.

10 Claims, 8 Drawing Sheets

MEMORY SELL

METHOD FOR ERASING NONVOLATILE SEMICONDUCTOR STORAGE DEVICE CAPABLE OF PREVENTING ERRONEOUS READING

BACKGROUND OF THE INVENTION

The present invention relates to an erasing method of a floating gate type nonvolatile semiconductor storage device.

In recent years, there has been a demand for reducing the power consumption in accordance with increase of integration level in a flash memory of a nonvolatile semiconductor storage device. In response to the above demand, a reduction in consumption of power is enabled by using the Fowler-Nordheim tunneling phenomenon for write (program) and erase operations. The flash memory that executes the write and erase operations utilizing the Fowler-Nordheim (referred to as FN hereinafter) tunneling phenomenon is called the FN—FN type flash memory.

On the other hand, flash memories are classified by the memory cell array structure, and four principal types will be enumerated hereinbelow.

[1] The Institute of Electronics, Information and Communication Engineers Technical Report, ICD93-128, p37, 1993

An AND type flash memory reported as ""AND" cell structure for a 3V-only 64Mbit Flash Memory"

[2] The Institute of Electronics, Information and Communication Engineers Technical Report, ICD93-26, p15, 1993

A DINOR type flash memory reported as "A Novel Cell Structure Suitable for a 3 Volt Operation, Sector Erase Flash Memory"

[3] IEDM Technical Digest, p263–266, 1995

A DuSNOR type flash memory reported as "A Novel Dual String NOR (DuSNOR) Memory Cell Technology Scalable to the 256 Mbit and 1 Gbit Flash Memories"

[4] IEDM Technical Digest, p267–270, 1995

An ACT type flash memory published in "A New Cell Structure for Sub-quarter Micron High Density Flash Memory" and "A sensing Scheme for a ACT flash memory" of The Institute of Electronics, Information and Communication Engineers Technical Report, ICD97-21, p37, 1997

The above types are published by several companies.

According to the flash memories of the above types [1] through [4], it is acceptable to execute electrical writing (program) and erasing on a memory cell. However, a voltage is applied to the drain, source or control gate of the selected memory cell in the write operation and the erase operation, while a voltage is also applied to the drain, source or control gate of the unselected memory cell. The threshold voltage of the unselected memory cell is changed by the influence of this voltage application, possibly causing erroneous reading In recent years, there is an increasing trend toward using a method for applying a negative voltage to the semiconductor substrate (well) in order to reduce the absolute value of a voltage to be used inside the flash memory in the erase operation. This negative voltage applied to the semiconductor substrate brings the unselected memory cell whose drain, source or control gate receives the voltage into a lightly erased state, exerting bad influence (referred to as a substrate disturbance hereinafter) on the threshold voltage of the unselected memory cell. The substrate disturbance tends to become more severe as the flash memory comes to have a larger capacity.

The aforementioned substrate disturbance will be described by taking the ACT (Asymmetrical Contactless Transistor) type flash memory as an example.

FIG. 6 shows a sectional view of one memory cell of the above ACT type flash memory, and the principle of operation of the ACT type flash memory will be described with reference to FIG. 6.

In the above ACT type flash memory of FIG. 6, a tunnel oxide film 14, a floating gate 15, an interlayer insulating film 16 and a control gate 17 are lamellarly formed on a substrate (p-type well) 11 so as to form a bridge between a drain 13 and a source 12 formed on the substrate 11. Then, the drain 13 and the source 12 have different donor concentrations.

In the case of a program operation in the ACT type flash memory having the aforementioned construction, that is, in the case where electrons are extracted from the floating gate 15 to provide a written state (data "0"), a negative voltage Vnw (−8 V) is applied to the control gate 17 and a positive voltage Vpp (+5 V) is applied to the drain 13, thereby extracting electrons from the floating gate 15 by the Fowler-Nordheim (referred to as FN hereinafter) tunneling phenomenon with the source 12 brought into the floating state. By this a program operation, the threshold voltage of the memory cell is lowered to a voltage of about 1.5 V.

In the case of an erase operation, that is, in the case where electrons are injected into the floating gate 15 to provide an erased state (data "1"), a positive voltage Vpe (+10 V) is applied to the control gate 17, a negative voltage Vns (−8 V) is applied to the source 12, and the drain 13 is brought into the floating state. Electrons are injected into the floating gate 15 by the FN tunneling phenomenon. Therefore, the threshold voltage of the memory cell is increased to a voltage of about 4 V or more.

In the case of a read operation, a voltage of +3 V is applied to the control gate 17, a voltage of +1 V is applied to the drain 13, and a voltage of 0 V is applied to the source 12. The data is read by the sensing circuit (not shown) for sensing the current flowing through the memory cell.

The voltages applied to the memory cell in the program, aforementioned operations are shown in Table 1.

TABLE 1

|  | Control Gate | Drain | Source | Substrate P-Type Well |
|---|---|---|---|---|
| Program Operation | −8 V | 5 V | Open | 0 V |
| Erase Operation | 10 V | Open | −8 V | −8 V |
| Read Operation | 3 V | 1 V | 0 V | 0 V |

In order to explain the substrate disturbance in the erase operation, the application voltage in the erase operation will be described with reference to the array structure of the ACT type flash memory shown in FIG. 7. As schematically shown in FIG. 7, the array structure of the ACT type flash memory has a virtual-ground-type array structure in which two memory cells jointly own an identical bit line.

In the above ACT type flash memory are shown main bit lines BL0 through BL4096, sub-bit lines SBL00 through SBL04096 and SBL10 through SBL14096 formed from a diffusion layer (the sub-bit lines being in a layer different from that of the main bit lines), word lines WL0 through WL63, selection gate signal lines SG0 and SG1 of selection transistors ST00 through ST04096 for selecting each block and a contact section CN (the portions each being indicated by the mark ■ in FIG. 7) of the main bit lines BL0 through BL4096 and the sub-bit lines SBL00 through SBL04096 and SBL10 through SBL14096. Then, in regard to the memory cells M00, M01, ... , M10, M11, ..., the number of contacts is reduced by making the memory cells of adjoining lines jointly own the sub-bit lines SBL01 through SBL04095 and SBL11 through SBL14095 and using the diffusion layer for the sub-bit lines SBL00 through SBL04096 and SBL10 through SBL14096, by which the array area is sharply reduced, allowing high-density integration to be achieved.

FIG. 8 schematically shows the sub-bit lines SBL00 through SBL04096 and SBL10 through SBL14096 (shown in FIG. 7) formed from the aforementioned diffusion layer in the form of a cross-section of the essential part of the ACT type flash memory.

As shown in FIG. 8, an interlayer insulating film 22, a floating gate 23 (FG) and a control gate 24 (WL) are lamellarly arranged on a semiconductor substrate 20 on which a sub-bit line 21 (diffusion layer) is formed. Then, the common sub-bit line 21 provided below the end portion of adjoining floating gates 23 (FG) has donor concentrations that differ between a drain 21a and a source 21b.

In the case of the aforementioned ACT type flash memory, the erasing operation is executed on a block basis. In the erase operation, for example, a positive voltage (+10 V) is applied to the word lines WL0 through WL31 connected to the control gates of the memory cells M00, M01, . . . of a selected block BLOCK0 shown in FIG. 7 in order to increase the threshold voltage of the memory cells. Further, a negative voltage (−8 V) is applied to a semiconductor substrate (well) and the main bit lines BL0 through BL4096. In this stage, the selection gate signal line SG0 has a voltage of 0 V to turn or the selection transistors ST00 through ST04096, and a negative voltage (−8 V) is applied to the sub-bit lines SBL01 through SBL04095. By this operation, a high electric field is generated between the floating gates and the channels of the memory cells M00, M01, . . . , by which electrons are injected into the floating gate by the FN tunneling phenomenon, increasing the threshold voltage of the n memory cells M00, M01, . . . to a voltage of 4 V.

On the other hand, in an unselected block BLCK1 in FIG. 7, a reference voltage Vss (0 V) is applied to the word lines WL32 through WL63. When a negative voltage (−8 V) is applied to the selection gate signal line SG1, then the selection transistors ST10 through ST14096 are turned off, as a consequence of which the sub-bit lines SBL10 through SBL14096 connected to the selection transistors ST10 through ST14096 are brought into the floating state. In this stage, the semiconductor substrate is common to all the memory cells. Therefore, the negative voltage (−8 V) is applied to the substrate, and an electric field is generated between the floating gate and the semiconductor substrate although the above electric field is less than that of the foregoing selected block. This electric field causes injection of electrons into the floating gate. The injection of electrons into the floating gate in the unselected block more frequently occurs in the memory cell in the low threshold voltage state, i.e., in the memory cell in the programmed state, i.e., in the memory cell of data "0".

Here is now considered the substrate disturbance in a 64-M flash memory in which 512 blocks each having a block size of 16 KB exist. If each block has been subjected to one million times of rewriting, assuming that each erasing time is 2 ms, then a disturbance time obtained by summing up the times applied to the unselected block in the above case is expressed by:

$$511 \times 1{,}000{,}000 \times 2 \text{ msec} \approx 10^6 \text{ sec} \tag{1}$$

FIG. 9 shows an example of the substrate disturbance in the erase operation. In FIG. 9, the horizontal axis represents the disturbance time, while the vertical axis represents the threshold voltage Vt (conditions:control gate voltage Vg of 0 V; drain Vd and source voltage Vs of floating; and substrate voltage Vsub of −8 V). As is apparent from FIG. 9, the threshold voltage of the memory cell becomes 3 V or more after a lapse of $10^6$ seconds of the disturbance time and becomes higher than the Ref voltage of 3 V of the sensing circuit in the reading stage, as a consequence of which data "0" is erroneously detected as data "1", resulting in erroneous reading.

A method for alleviating she substrate disturbance as described above is disclosed in the prior art reference of Japanese Patent Laid-Open Publication No. HEI 10-92958 concerning the AND type flash memory. In this specification, a description of the AND type flash memory will be given on condition that memory cell characteristics of this erasing method are similar to the characteristics of the aforementioned ACT type flash memory in order to clarify the problem of the erasing method of the non-volatile semiconductor storage device. That is, the application voltage conditions in the program operation and the erase operation are assumed to be similar to those of Table 1.

As shown in FIG. 10, an AND type flash memory has an array structure in which memory cells M00, M01, . . . , M10, M11, . . . are arranged in a matrix form, each of the memory cells being constructed of a floating gate type field-effect transistor capable of electrically writing and erasing information. Word lines WL0 through WL31 and WL32 through WL63 are connected to control gates of the memory cells M00, M01, . . . , M10, M11, arranged in an identical row. The memory cells M00, M01, . . . whose control gates are connected to the word lines WL0 through WL31 belong to a BLOCK0. The memory cells M10, M11, . . . whose control gates are connected to the word lines WL32 through WL63 belong to a BLOCK1. In the memory cells M00, M01, . . . of the BLOCK0, sub-bit lines SBL00 through SBL04094 are jointly connected to drains of the memory cells arranged in an identical column, while source lines SL00 through SL04094 are jointly connected to sources of the memory cells arranged in an identical column. Main bit lines BL0 through BL4094 are connected to the sub-bit lines SBL00 through SBL04094 via selection transistors ST00A through ST04094A, while a selection gate signal line DSG0 is connected to the gates of the selection transistors ST00A through ST04094A. A common source line SL is connected to the source lines SL00 through SL04094 via selection transistors ST00B through ST04094B, while a selection gate signal line SSG0 is connected to the gates of the selection transistors ST00B through ST04094B. In the memory cells M10, M11, . . . of the BLOCK1, sub-bit lines SBL10 through SBL14094 are connected to the drains of the memory cells of an identical column, while source lines SL10 through SL14094 are connected to the sources of the memory cells of an identical column. The main bit lines BL0 through BL4094 are connected to the sub-bit lines SBL10 through SBL14094 via selection transistors ST10A through ST14094A, while a selection gate signal line DSG1 is connected to the gates of the selection transistors ST10A through ST14094A. The common source line SL is connected to the source lines SL10 through SL14094 via selection transistors ST10B through ST14094B, while a selection gate signal line SSG1 is connected to the gates of the selection transistors ST10B through ST14094B.

In the AND type flash memory having the aforementioned construction, the case is herein considered where information of memory shells M00, M01, . . . , in the selected block BLOCK0 is subjected to erasing.

A high positive voltage Vpp (+10 V, for example) is applied to the word lines WL0 through WL31 of the selected block BLOCK0, and a voltage Vnv (−8 V, for example) is applied to all the main bit lines BL0 through BL4094 and a semiconductor substrate (well). A reference voltage Vss (0 V, for example) is applied to the source lines SL00 through SL4094 via the common source line SL. In this stage, the reference voltage Vss (0 V, for example) is applied to the selection gate signal line DSG0 and the voltage Vnv (−8 V, for example) is applied to the selection gate signal line SSG0. Then, the selection transistors ST00A through ST04094A whose gates are connected to the selection gate signal line DSG0 are turned on, so that the voltage Vnv (−8 V, for example) is outputted to the sub-bit lines SBL00 through SBL04094. The selection transistors ST00B through ST04094B whose gates are connected to the selection gate signal line SSG0 are turned off, so that the diffusion source lines SL00 through SL04094 are brought into the floating state. By this operation, the channels of the memory cells M00, M01, . . . of the selected block BLOCK0 are turned on, by which the channel layer comes to have a voltage of −8 V to inject electrons into the floating gate. Consequently, the threshold voltage of the memory cells M00, M01, . . . of the selected block BLOCK0 increases to end the erasing.

On the other hand, in the unselected block BLOCK1, the reference voltage Vss (0 V) is applied to the word lines WL32 through WL63 connected to the control gates of the memory cells M10, M11, . . . The voltage Vnv (−8 V) is applied to the selection signal gate line DSG1, so that the selection transistors ST10A through ST14094A whose gates are connected to the selection gate signal line DSG1 are turned off, and consequently the sub-bit lines SBL10 through SBL14094 are brought into the floating state. By applying the voltage Vcc (+3 V) to the selection gate signal line SSG1 and turning on the selection transistors ST10B through ST14096B whose gates are connected to the selection gate signal line SSG1, by which the reference voltage Vss (0 V) is outputted to the source lines SL10 through SL14094 formed from the diffusion layer via the common source line SL. By this operation, a depleted layer is formed instead of a channel layer in the semiconductor substrate (well) just below the tunnel oxide film of the memory cells M10, M11, . . . of the unselected block BLOCK1. For the above reasons, the electric field between the floating gate and the semiconductor substrate (well) is alleviated, by which the substrate disturbance is alleviated.

However, in the aforementioned AND type flash memory, some of the sub-bit lines SBL10 through SBL14094 in the floating state come to immediately have the voltage of −8 V when the voltage of −8 V is applied to the semiconductor substrate (well) due to the diffusion leak (including minute defects) and so on.

For example, the case is considered where a leak current of 0.1 μA exists in the sub-bit line formed from the diffusion layer. This is because the threshold voltage of a memory cell is generally defined as the voltage of the word line when the current flowing through the memory cell is 1 μA in the case of the flash memory, and there are practically many sub-bit lines through which the leak current of about 0.1 μA flows.

In the case of the flash memory, it is practical that the leak current of the diffusion layer is not so much reduced by comparison with the DRAM.

In this case, the voltage of −8 V is applied to the semiconductor substrate (well), and a time Ts during which the sub-bit line that should be in the floating state comes to have the voltage of −8 V is expressed by:

$$Ts = Q/Ir$$
$$= CV/Ir$$
$$= 0.02 \text{ pF} \times |-8 \text{ V}|/0.1 \text{ μA}$$
$$= 1.6 \text{ μsec}$$

where C: sub-bit line capacitance (0.02 pF)
V: sub-bit line voltage (−8 V)
Ir: leak current (0.1 μA)

Normally, the erase pulse time is about 1 ms, and therefore, the sub-bit line comes to sufficiently have the voltage of −8 V. In this case, the channel layer is formed in the vicinity of the sub-bit line, as a consequence of which a high electric field is generated between the floating gate and the channel layer (−8 V) in the portion, and electrons are injected into the floating gate, increasing the threshold voltage. In practice, when the memory cell channel layer is sufficiently turned on (i.e., when the channel layer is formed between the source and the drain), the source side of the sub-bit line, which is connected to the common source line SL, comes to have a voltage of 0 V, and therefore, the sub-bit line comes to have a voltage (−6 V, For example) higher than the voltage of −8 V, instead of the voltage of −8 V. However, if the sub-bit line comes to have a voltage higher than −6 V, then the channel layer is cut off by a back gate effect. Therefore, the sub-bit line does not come to have a voltage higher than −6 V (the absolute value is not reduced). The voltage of this sub-bit line differs depending on the threshold voltage and so on of the memory cell.

Therefore, the nonvolatile semiconductor storage device erasing method described above has an disadvantage that the substrate disturbance cannot be stably alleviated.

SUMMARY OF THE INVENTION

Accordingly, an object of the present invention is to provide a nonvolatile semiconductor storage device erasing method capable of suppressing a change in the threshold voltage due to the substrate disturbance in the erase operation, for the prevention of erroneous reading.

In order to achieve the aforementioned object, the present invention provides a method for erasing a nonvolatile semiconductor storage device, said device comprising: a memory cell array divided into blocks in each of which memory cells are arranged in a matrix form on a semiconductor substrate, each of the memory cells being comprised of a floating gate type field-effect transistor that has a control gate, a drain and a source and is able to electrically be programmed and erased by using a Fowler-Nordheim tunneling phenomenon; word lines each connected to control gates of the memory cells arranged in an identical row; sub-bit lines each connected to the drains or the sources of the memory cells arranged in an identical column; and main bit lines each connected to an associated sub-bit line so as to form a layered structure together with the associated sub-bit line, wherein: in an erase operation of a selected block of the memory cell array, a first negative voltage is applied to the semiconductor substrate, a first positive voltage is applied to the word lines of an unselected block of the memory cell array, and a reference voltage is applied to the sub-bit lines of the unselected block so that memory cells in a low threshold voltage state within the unselected block are turned on, and that a channel layer formed in each of the memory cells which have been turned on comes to have the reference voltage.

According to the present invention, in a nonvolatile semiconductor storage device that has an array structure of ACT, AND, DuSNOR or DINOR type and uses the Fowler-Nordheim tunneling phenomenon for the program (write) operation and the erase operation, in the erase operation, the first negative voltage is applied to the substrate, the first positive voltage is applied to the word lines of the unselected block of the memory cell array, and the reference voltage is applied to the sub-bit lines of the unselected block. Then, each of the memory cells that belong to the unselected block and are in the low threshold voltage state is turned on to form a channel layer. The reference voltage is applied to the sources or drains of the memory cells via the sub-bit lines. Therefore, the channel layers come to have the reference voltage, as a consequence of which the potential difference between the channel and the control gate to which the first positive voltage is applied becomes small. This reduces the electric field between the floating gate and the channel layer, allowing the substrate disturbance in the erase operation to be alleviated. Therefore, a change in the threshold voltage due to the substrate disturbance in the erase operation is suppressed, and this can prevent the erroneous reading.

In an embodiment of the invention, the first positive voltage is higher than a threshold voltage at which the memory cells in the low threshold voltage state are turned on.

According to the above embodiment, by making the first positive voltage applied to the word lines of the unselected block of the memory cell array higher than the threshold voltage at which the memory cells in the low threshold voltage state are turned on, each of the memory cell in the programmed state (data "0") is turned on to form a channel layer.

The present invention also provides a method for erasing a nonvolatile semiconductor storage device, said device comprising: a memory cell array divided into blocks in each of which memory cells are arranged in a matrix form on a semiconductor substrate, each of the memory cells being comprised of a floating gate type field-effect transistor that has a control gate, a drain and a source and is able to electrically be programmed and erased by using a Fowler-Nordheim tunneling phenomenon; word lines each connected to control gates of the memory cells arranged in an identical row; sub-bit lines each connected to the drains or the sources of the memory cells arranged in an identical column; and main bit lines each connected to an associated sub-bit line so as to form a layered structure together with the associated sub-bit line, wherein: in an erase operation of a selected block of the memory cell array, a first negative voltage is applied to the semiconductor substrate, a reference voltage is applied to the word lines of an unselected block of the memory cell array, and a second negative voltage is applied to the sub-bit lines of the unselected block so that memory cells in a low threshold voltage state within the unselected block are turned on, and that a channel layer formed in each of the memory cells which have been turned on comes to have the second negative voltage.

According to the present invention, in a nonvolatile semiconductor storage device having an array structure that has a common source of AND, DuSNOR or DINOR type and uses the Fowler-Nordheim tunneling phenomenon for the write operation and the erase operation, in the erase operation, the first negative voltage is applied to the substrate, the reference voltage is applied to the word lines of the unselected block of the memory cell array and the second negative voltage is applied to the sub-bit lines of the unselected block. Then, each of the memory cells that belong to the unselected block and are in the low threshold voltage state is turned on to form a channel layer. The second negative voltage is applied to the sources or drains of the memory cells via each of the sub-bit lines. Therefore, the channel layer comes to have the second negative voltage, as a consequence of which the potential difference between the control gate to which the reference voltage is applied and the channel becomes small. This reduces the electric field between the floating gate and the channel layer, allowing the substrate disturbance in the erase operation to be alleviated. Therefore, a change in the threshold voltage due to the substrate disturbance in the erase operation is suppressed, and this can prevent the erroneous reading.

In an embodiment of the invention, an absolute value of the second negative voltage is smaller than an absolute value of the first negative voltage.

According to the above embodiment, by making the absolute value of the second negative voltage applied to the sub-bit lines of the unselected block smaller than the absolute value of the first negative voltage applied to the semiconductor substrate, the back gate effect can be reduced. Therefore, the memory cells that belong to the unselected block and are in the low threshold voltage state can be stably turned on, and this obviates the need for the circuit for boosting the voltage to be applied to the word lines.

The present invention further provides a method for erasing a nonvolatile semiconductor storage device, said device comprising: a memory cell array divided into blocks in each of which memory cells are arranged in a matrix form on a semiconductor substrate, each of the memory cells being comprised of a floating gate type field-effect transistor that has a control gate, a drain and a source and is able to electrically be programmed and erased by using a Fowler-Nordheim tunneling phenomenon; word lines each connected to control gates of the memory cells arranged in an identical row; sub-bit lines each connected to the drains or the sources of the memory cells arranged in an identical column; and main bit lines each connected to an associated sub-bit line so as to form a layered structure together with the associated sub-bit line, wherein: adjoining memory cells jointly own an identical sub-bit line, in an erase operation of a selected block of the memory cell array, a first negative voltage is applied to the semiconductor substrate, a first positive voltage is applied to the word lines of an unselected block of the memory cell array, and a reference voltage is applied to the sub-bit lines of the unselected block so that memory cells in a low threshold voltage state within the unselected block are turned on, and that a channel layer formed in each of the memory cells which have been turned on comes to have the reference voltage.

According to the present invention, in the ACT type flash memory having a virtual-ground-type array, the first positive voltage is applied to the word lines of the unselected block of the memory cell array in the erase operation, and the reference voltage is applied to the sub-bit lines of the unselected block. Then, each of the memory cells that belong to the unselected block and are in the low threshold voltage state is turned on to form a channel layer. The reference voltage is applied to the sources or drains of the memory cells via each of the sub-bit lines. Therefore, the channel layer comes to have the reference voltage, and the potential difference be-ween the control gate to which the first positive voltage is applied and the channel becomes small. This reduces the electric field between the floating gate and the channel layer, allowing the substrate disturbance in the erase operation to be alleviated. Therefore, a change in the threshold voltage due to the substrate disturbance in the erase operation is suppressed, and this can prevent the erroneous reading.

In an embodiment of the invention, the first negative voltage is applied to either one of an even-number main bit line and an odd-number main bit line of the main bit lines, and the reference voltage is applied to the other one or the even-number main bit line and the odd-number main bit line of the main bit lines.

According to the above embodiment, the selected block that belongs to the memory cell array and is to be subjected to erasing, the main bit line to which the first negative voltage is applied is connected to the memory cell via the sub-bit line, and the main bit line to which the reference voltage is applied is connected to the memory cell via the sub-bit line in the unselected block of the memory cell array.

The present invention still further provides a method for erasing a nonvolatile semiconductor storage device, said device comprising: a memory cell array divided into blocks in each of which memory cells are arranged in a matrix form on a semiconductor substrate, each of the memory cells being comprised of a floating gate type field-effect transistor that has a control gate, a drain and a source and is able to electrically be programmed and erased by using a Fowler-Nordheim tunneling phenomenon; word lines each connected to control gates of the memory cells arranged in an identical row; sub-bit lines each connected to the drains or the sources of the memory cells arranged in an identical column; and main bit lines each connected to an associated sub-bit line so as to form a layered structure together with the associated sub-bit line, wherein: adjoining memory cells jointly own an identical sub-bit line, in an erase operation of a selected block of the memory cell array, a first negative voltage is applied to the semiconductor substrate, a reference voltage is applied to the word lines of an unselected block of the memory cell array, and a second negative voltage is applied to the sub-bit lines of the unselected block so that memory cells in a low threshold voltage state within the unselected block are turned on, and that a channel layer formed in each of the memory cells which have been turned on comes to have the second negative voltage.

According to the present invention, in the ACT type flash memory having the virtual-ground-type array, the reference voltage is applied to the word line of the unselected block of the memory cell array in the erase operation, and the second negative voltage is applied to the sub-bit line of the unselected block. By this operation, the memory cell that belongs to the unselected block and is in the low threshold voltage state is turned on to form a channel layer. The second negative voltage is applied to the source or drain of the memory cell via the sub-bit line. Therefore, the channel layer comes to have the second negative voltage, and the potential difference between the control gate to which the above voltage is applied and the channel becomes small. This reduces the electric field between the floating gate and the channel layer, allowing the substrate disturbance in the erase operation to be alleviated. Therefore, a change in the threshold voltage due to the substrate disturbance in the erase operation is suppressed, and this can prevent the erroneous reading In an embodiment of the invention, the first negative voltage is applied to either one of an even-number main bit line and an odd-number main bit line of the main bit lines, and the second negative voltage is applied to the other one of the even-number main bit line and the odd-number main bit line of the main bit lines.

According to the above embodiment, the main bit line to which the first negative voltage is applied is connected to the memory cell via the sub-bit line in the selected block that belongs to the memory cell array and is to be subjected to erasing, while the main bit line to which the second negative voltage is applied is connected to the memory cell via the sub-bit Line in the unselected block of the memory cell array.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
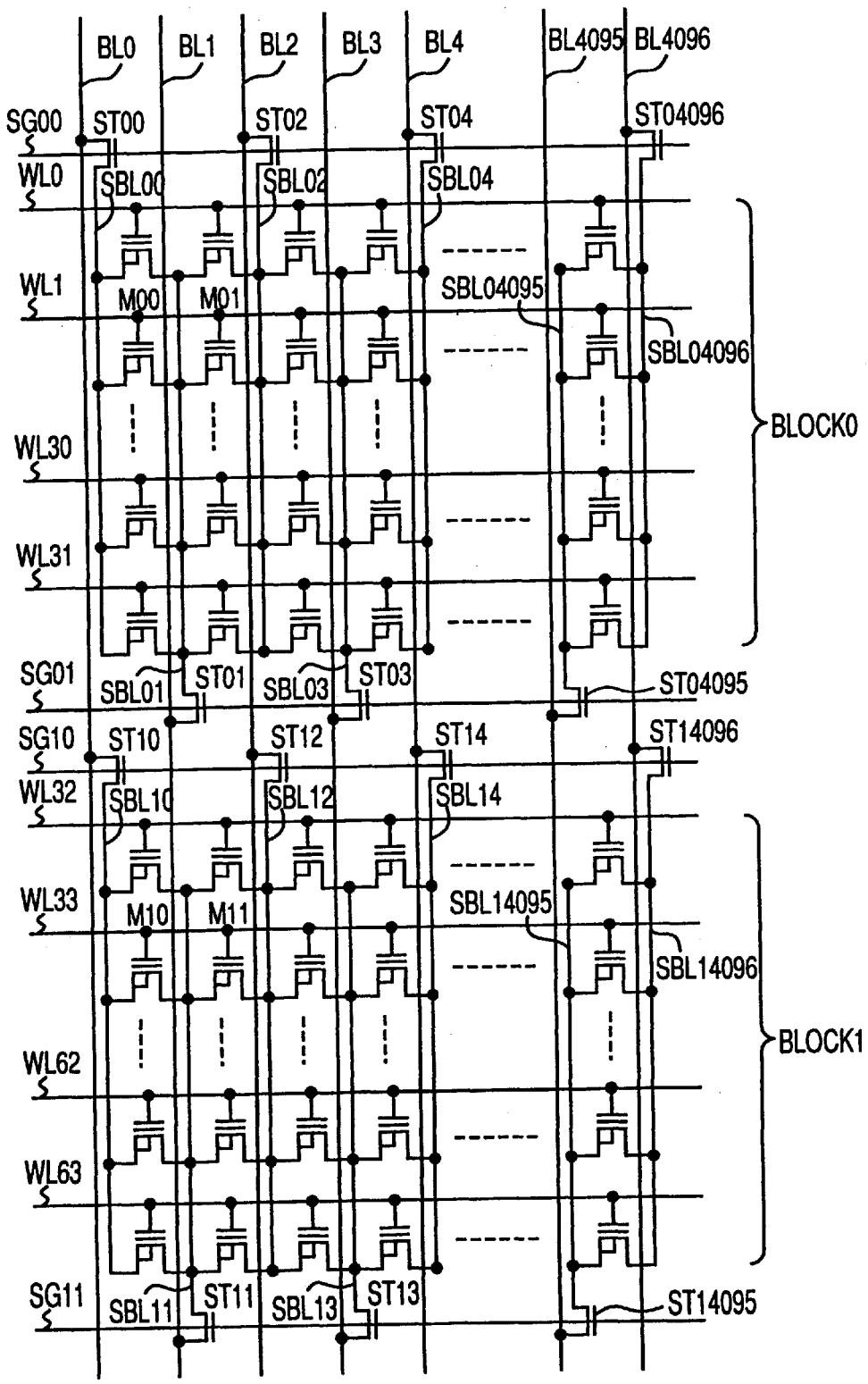
FIG. 1 is a circuit diagram showing an ACT type flash memory array structure using a nonvolatile semiconductor storage device erasing method according to a first embodiment of the present invention.

A nonvolatile semiconductor storage device erasing method of the present invention will be described in detail below on the basis of embodiments shown in the drawings.

First Embodiment

FIG. 1 is a circuit diagram showing a virtual-ground-type array structure of an ACT type flash memory employing a nonvolatile semiconductor storage device erasing method according to a first embodiment of the present invention.

As shown in FIG. 1, the ACT type flash memory has memory cells M00, M01, . . . , M10, M11, . . . each being constructed of a floating gate type field-effect transistor capable of electrically writing and erasing information. The memory cells M00, M01, ..., M10, M11, ... are arranged in a matrix form, and word lines WL0 through WL31 and WL32 through WL63 each are connected to control gates of the memory cells arranged in a row. The memory cells M00, M01, ... whose control gates are connected to the word lines WL0 through WL31 belong to a BLOCK0, while the memory cells M10, M11, ... whose control gates are connected to the word lines WL32 through WL63 belong to a BLOCK1.

In the memory cells M00, M01, ... of the BLOCK0, sub-bit lines SBL00 through SBL04096 each are connected to drains or sources of the memory cells arranged in a column. Main bit lines BL0 through BL4096 are connected to the sub-bit lines SBL00 through SBL04096 via selection transistors ST00 through ST04096. A selection gate signal line SG00 is connected to gates of the selection transistors ST00, ST02, ..., ST04096, while a selection gate signal line SG01 is connected to gates of the selection transistors ST01, ST03, ..., ST04095.

In the memory cells M10, M11, ... of the BLOCK1, sub-bit lines SBL10 through SBL14096 each are connected to drains or sources of the memory cells arranged in a column. The main bit lines BL0 through BL4096 are connected to the sub-bit lines SBL10 through SBL14096 via selection transistors ST10 through ST14096. A selection gate signal line SG10 is connected to gates of the selection transistors ST10, ST12, ..., ST14096, while a selection gate signal line SG11 is connected to gates of the selection transistors ST11, ST13, ... ST14095.

In the case where the BLOCK0 is subjected to erasing in the ACT type flash memory having the aforementioned construction, the word lines WL0 through WL31 are first set to a voltage Vpp (+10 V, for example). The semiconductor substrate (well) is set to a first negative voltage Vneg (−8 V, for example). On the other hand, the even-number main bit lines BL0, BL2, BL4, ..., BL4096 are set to the first negative voltage Vneg (−8 V), while the odd-number main bit lines BL1, BL3, ..., BL4095 are set to a reference voltage Vss (0 V, for example). The reference voltage Vss is applied to the selection gate signal line SG00, while the negative voltage Vneg is applied to the selection gate signal line SG01. Then, since the selection gate signal line SG00 has the reference voltage Vss, the selection transistors ST00 through ST04096 whose gates are connected to the selection gate signal line SG00 are turned on. Therefore, the negative voltage Vneg is outputted to the sub-bit lines SBL00, SBL02, SBL04, ..., SBL04096 formed from a diffusion layer. The selection gate signal line SG01 has the negative voltage Vneg, and therefore, the selection transistors ST01 through ST04095 whose gates are connected to the selection gate signal line SG01 are turned off, and the sub-bit lines SBL01, SBL03, ..., SBL04095 are brought into a floating state. In this stage, for example, the memory cell M00 is turned on since the word line WL0 has the voltage Vpp, resultingly forming a channel layer. The sub-bit line SBL00 has the negative voltage Vneg, and therefore, the channel layer comes to have the negative voltage Vneg. Consequently, a high electric field is generated between the floating gate and the channel layer, and electrons are injected from the channel layer into the floating gate, increasing a threshold voltage of the memory cell M00. The sub-bit line SBL02 has the negative voltage Vneg in the memory cell M01, and therefore, a channel layer of the memory cell M01 comes to have the negative voltage Vneg. Consequently, a high electric field is generated between the floating gate and the channel layer, and electrons are injected from the channel layer into the floating gate, increasing a threshold voltage of the memory cell M01. Likewise, all the memory cells inside the selected block BLOCK0 are subjected to erasing as a consequence of an increase in the threshold voltage.

On the other hand, in the unselected block BLOCK1, a voltage Vcc (+3 V, for example) is applied to the word lines WL32 through WL63. The negative voltage Vneg (−8 V) is applied to the selection gate signal line SG10, while the first positive voltage Vcc (+3 V, for example) is applied to the selection gate signal line SG11. The odd-number main bit lines BL1, BL3, ..., BL4095 have received the reference voltage Vss as described hereinabove, and the selection transistors ST11 through ST14095 whose gates are connected to the selection gate signal line SG11 are turned on. Therefore, the reference voltage Vss (0 V) is outputted to the sub-bit lines SBL11, SBL13, ..., SBL14095 formed from the diffusion layer. On the other hand, the selection transistors ST10 through ST14096 whose gates are connected to the selection gate signal line SG10 are off, and therefore, the sub-bit lines SBL10, SBL12, SBL14, ..., SBL14096 are brought into the floating state.

In this case, the memory cell in the low threshold voltage state (the memory cell programmed with data "0") inside the unselected block BLOCK1 is turned on since Vcc (3 V, for example) is applied to the word lines WL32 through WL63. Assuming that, for example, the memory cell M10 is in the programmed state, then the threshold voltage of the memory cell M10 is about 1.5 V. Therefore, the memory cell M10 is turned on to form a channel layer. The reference voltage Vss (0 V) is applied to the sub-bit line SBL11 from the main bit line BL1 via the selection transistor ST11, and therefore, the channel layer comes to have the reference voltage Vss (0 V) via the source or drain connected to the sub-bit line SBL11.

Through the above operation, the control gate connected to the word lines WL32 through WL63 comes to have a voltage of +3 V, while the channel layer comes to have a voltage of 0 V in the memory cells M10, M11, ... of the unselected block BLOCK1. Therefore, the electric field between the floating gate and the channel layer is alleviated, consequently alleviating the substrate disturbance (according to the conventional technique, a voltage of 0 V is applied to the control gate, and the sub-bit line disadvantageously comes to have a voltage of −8 V when leak or coupling occurs in the diffusion layer, as a consequence of which the channel layer comes to have a voltage close to −8 V, providing a great electric field between the floating gate and the channel layer).

Figure 2:
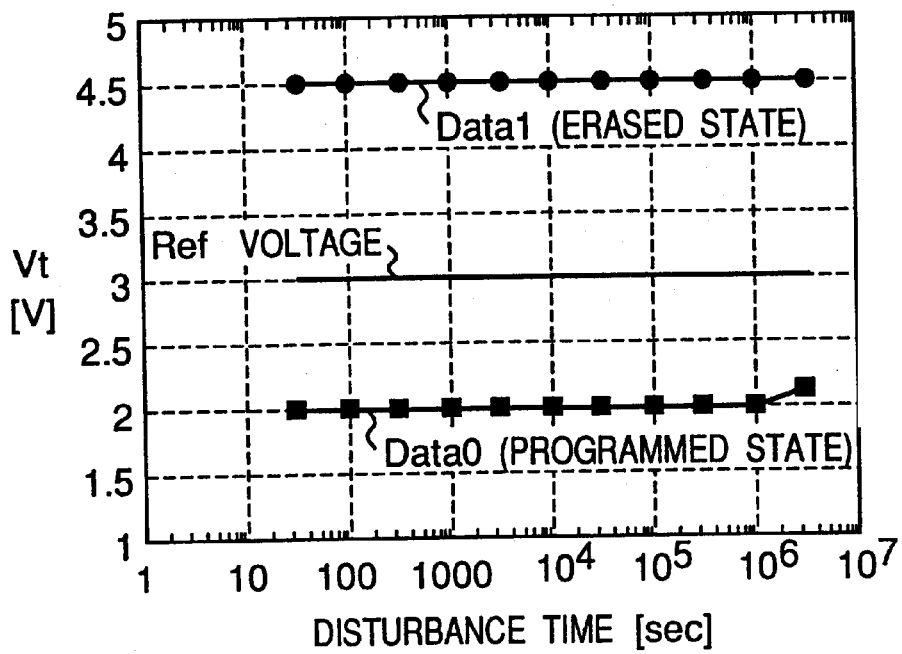
FIG. 2 is a graph showing the disturbance characteristics of the ACT type flash memory of FIG. 1.

The influence of the substrate disturbance in this first embodiment is shown in FIG. 2, In FIG. 2, the horizontal axis represents the disturbance time, while the vertical axis represents the threshold voltage Vt (conditions: control gate voltage Vg of 3 V; drain Vd of 0 V, source voltage Vs floating; and substrate voltage Vsub of −8 V).

As is apparent from FIG. 2, the threshold voltage of the memory cell (programmed state) in the low threshold voltage state varies a little even after a lapse of $10^6$ seconds [one million times of rewriting are guaranteed on the condition of the equation (1)] in the memory cell of the unselected block in a 64-M flash memory. The threshold voltage of the memory cell remains at a value sufficiently lower than the reference voltage (Ref voltage) for detecting data from the sensing circuit (not shown) connected to the main bit line in the data reading stage. Therefore, the threshold voltage of the memory cell has a sufficient margin with respect to the Ref voltage of the sensing circuit, and therefore, data can be read even from the memory cell (programmed state) in the low threshold voltage state without any error even under the influence of the substrate disturbance.

The memory cell in the erased state (of a threshold voltage of not lower than 4 V), of course, has no problem.

Second Embodiment

The nonvolatile semiconductor storage device erasing method of the second embodiment of the present invention is used for an ACT type flash memory having the same construction as that of the ACT type flash memory of the first embodiment shown in FIG. 1, and reference should be made to FIG. 1. In connection with the ACT type flash memory of the first embodiment, there has been described the fact that the substrate disturbance in the erase operation can be reduced. According to this second embodiment, there is proposed a nonvolatile semiconductor storage device erasing method obtained by further improving the following points (1) through (3) of the first embodiment.

(1) In the selection transistor in which the main bit line comes to have a voltage of 0 V, there occurs a state in which a voltage of 0 V is applied to the source and a voltage of −8 V is applied to the substrate, providing a potential difference of 8 V between the source and the substrate. Therefore, the source region is required to have a DDD (Double Doped Drain) structure or an LDD (Lightly Doped Drain) structure in order to provide a dielectric tolerance, for which the area of the selection transistor is increased.

(2) There are prepared three voltages of a reference voltage Vss (0 V), a negative voltage Vneg (−8 V) and a voltage Vcc (3 V) to be applied to the selection transistor, and a circuit for switching the three types of voltages becomes complicated.

(3) Although the threshold voltage of the memory cell of the data "0" is not higher than 2 V, the back gate effect is great since the substrate has a voltage of −8 V and the drain or source has a voltage of 0 V. Therefore, depending on the density of the channel region, the channel is not turned on unless a voltage higher than Vcc (3 V, for example) is applied to the control gate. Therefore, the word lines WL32 through WL63 of the unselected block BLOCK1 require a voltage higher than Vcc. Although not shown, a circuit for boosting the word line voltage is needed, and the layout area increases.

An erasing method for solving the aforementioned three points will be described below.

Figure 3:
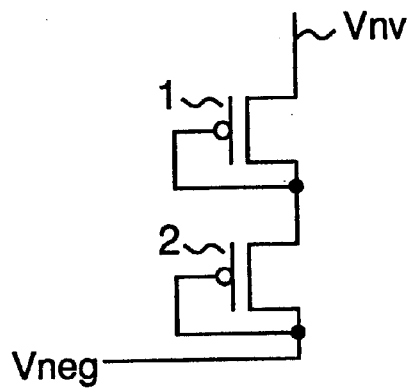
FIG. 3 is a diagram showing a disturbance preventing voltage generating circuit for an ACT type flash memory using a nonvolatile semiconductor storage device erasing method according to a second embodiment of the present invention.

In the case where BLOCK0 is subjected to erasing in the ACT type flash memory shown in FIG. 1, the word lines WL0 through WL31 are set to a voltage Vpp (+10 V, for example). The semiconductor substrate (well) voltage is set to a first negative voltage Vneg (−8 V, for example). The even-number main bit lines BL0, BL2, BL4, . . . , BL4096 are set to the first negative voltage Vneg, while the odd-number main bit lines BL1, BL3, . . . , BL4095 are set to a disturbance preventing voltage Vnv (−4 V, for example) that serves as a second negative voltage. This disturbance preventing voltage Vnv can be easily formed from the negative voltage Vneg (−8 V) by two p-MOS transistors 1 and 2 that are connected in series as shown in FIG. 3. The reference voltage Vss is applied to the selection gate signal line SG00, and the negative voltage Vneg is applied to the selection gate signal line SG01. Then, the selection gate signal line SG00 has the reference voltage Vss, and therefore, the selection transistors ST00 through ST04096 whose gates are connected to the selection gate signal line SG00 are turned on. Therefore, the negative voltage Vneg is outputted to the sub-bit lines SBL00, SBL02, SBL04, . . . , BL04096. On the other hand, the selection gate signal line SG01 has the negative voltage Vneg, and therefore, the selection transistors ST01 through ST14096 whose gates are connected to the selection gate signal line SG01 are turned off, and the sub-bit lines SBL01, SBL03, . . . , SBL04095 are brought into the floating state. In this stage, for example, the memory cell M00 is turned on since the word line WL0 has the voltage Vpp, forming a channel layer. The sub-bit line SBL00 has the negative voltage Vneg, and therefore, the channel layer formed in the memory cell M00 comes to have the negative voltage Vneg. Consequently, a high electric field is generated between the floating gate and the channel layer, and electrons are injected from the channel layer into the floating gate, increasing the threshold voltage of the memory cell M00. The sub-bit line SBL02 has the negative voltage Vneg in the memory cell M01, and therefore, the channel layer of the memory cell M01 comes to have the negative voltage Vneg. Consequently, a high electric field is generated between the floating gate and the channel layer, and electrons are injected from the channel layer into the floating gate, increasing the threshold voltage of the memory cell M01. Likewise, all the memory cells inside BLOCK0 are subjected to erasing as a consequence of an increase in the threshold voltage.

On the other hand, in the unselected block BLOCK1, the reference voltage Vss (0 V, for example) is applied to the word lines WL32 through WL63. The negative voltage Vneg is applied to the selection gate signal line SG10, and the reference voltage Vss (0 V, for example) is outputted to the selection gate signal line SG11. The odd-number main bit lines BL1, BL3, . . . , BL4095 have a disturbance preventing voltage Vnv (−4 V, for example), and therefore, the voltage Vnv is outputted to the sub-bit lines SBL11, SBL13, . . . , SBL14095 formed from the diffusion layer shown in FIG. 1, while the sub-bit lines SBL10, SBL12, SBL14, . . . , SBL14096 are brought into the floating state. In this case, in the memory cell (memory cell programmed with data "0") that belongs to the unselected block BLOCK1 and is in the low threshold voltage state, the memory cell is turned on to form a channel layer since the substrate has the negative voltage Vneg (−8 V, for example) and the drain or source has the voltage Vnv (−4 V, for example) although the word lines WL32 through WL63 have the reference voltage Vss (0 V, for example). Then, the sub-bit line SBL11 has the voltage Vnv (−4 V, for example), and therefore, the channel layer comes to have the voltage Vnv (−4 V, for example). Consequently, the electric field between the floating gate and the channel layer is alleviated, and the substrate disturbance is reduced. According to the nonvolatile semiconductor storage device erasing method of the present invention, an electric field of 0 V and an electric field of −4 V are applied to the control gate and the channel layer, respectively.

Figure 4:
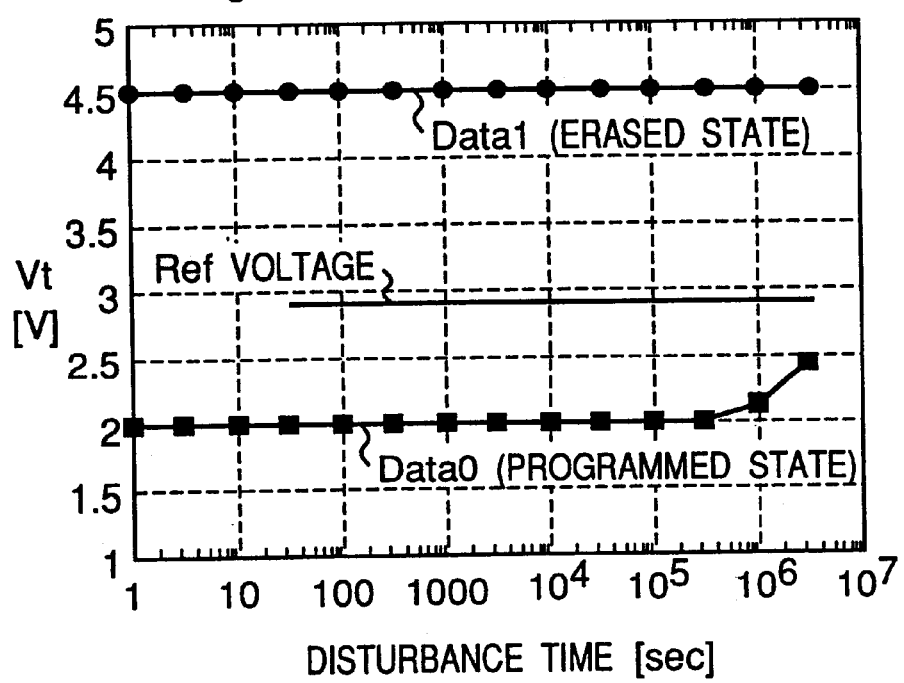
FIG. 4 is a graph showing the disturbance characteristics of the ACT type flash memory of FIG. 3.

The influence of the disturbance in this second embodiment is shown in FIG. 4 (conditions: control gate voltage Vg of 0 V; drain voltage Vd of −4 V; source voltage Vs floating; and substrate voltage Vsub of −8 V ). In FIG. 4, the horizontal axis represents the disturbance time, while the vertical axis represents the threshold voltage Vt. As is apparent from FIG. 4, the threshold voltage varies a little even in the memory cell that has data "0" susceptible to substrate disturbance and is in the low threshold voltage state even after a lapse of $10^6$ seconds of the disturbance time in the 64-M flash memory, and the threshold voltage is sufficiently lower than the Ref voltage of the sensing circuit. Therefore, the threshold voltage of the memory cell of data "0" has a sufficient margin for the Ref voltage of the sensing circuit, and therefore, the data "0" can be read even under the influence of substrate disturbance.

Furthermore, −4 V is applied as a disturbance preventing voltage to the source of the selection transistor. A difference to the semiconductor substrate swell) voltage of −8 V is −4 V, which is small enough to obviate the need for the provision of the DDD structure or the LDD structure. Only two voltages of the reference voltage Vss (0 V, for example) and the negative voltage Vneg (−8 V, for example) are required to be applied to the selection transistor, and therefore, the formation of the decoder (not shown) for executing voltage changeover is easy.

In the memory cells M10, M11, . . . , of the unselected block BLOCK1, the voltage of the drain or the source becomes −4 V, and therefore, the voltage difference relative to the semiconductor substrate (well) voltage of −8 V becomes 4 V. Therefore, the same state as in the case where the back gate has a voltage of −4 V and the control gate connected to the word line has a voltage of 4 V is provided although the voltage of the control gate connected to the word lines WL32 through WL63 is 0 V. If the back gate effect is smaller than that of the first embodiment and the threshold voltage is not higher than 2 V, then the memory cell is easily turned on. Therefore, the word line of the unselected block is not required to be boosted.

As described above, if the nonvolatile semiconductor storage device erasing method of this second embodiment is used, a further improvement can be achieved by comparison with the first embodiment.

Third Embodiment

Figure 5:
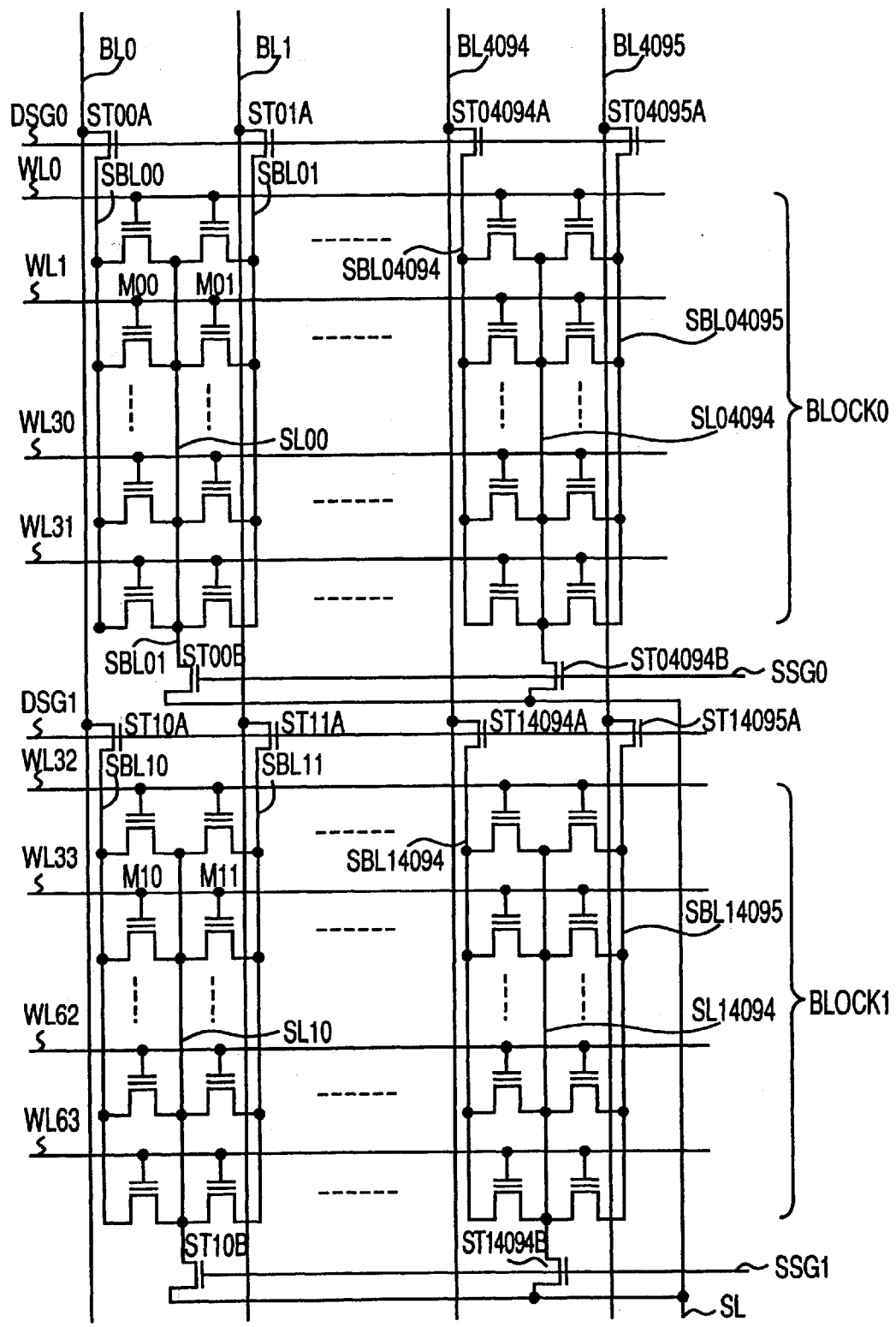
FIG. 5 is a circuit diagram showing a DuSNOR type flash memory array structure using a nonvolatile semiconductor storage device erasing method according to a third embodiment of the present invention.
Figure 6:
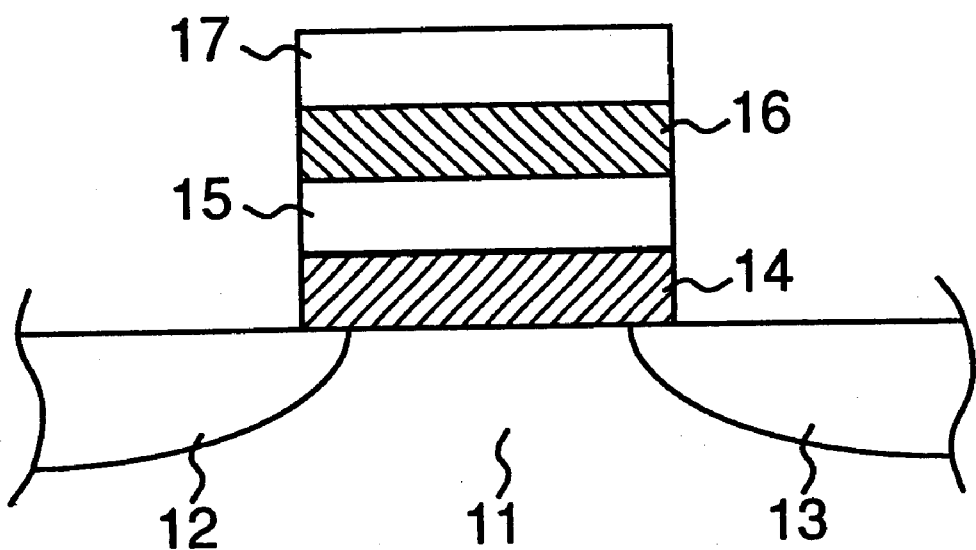
FIG. 6 is a sectional view showing a basic structure of a conventional flash memory.
Figure 7:
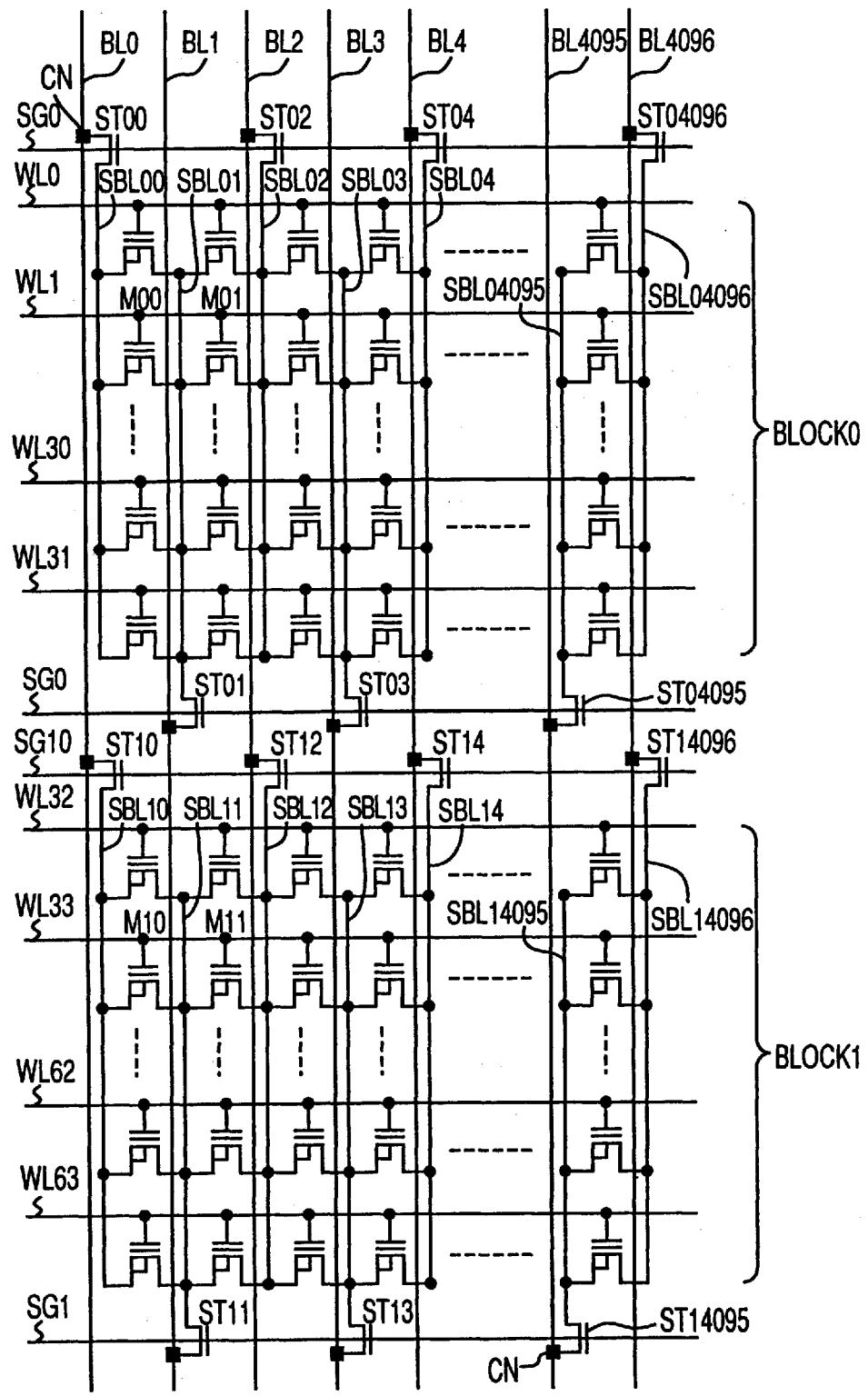
FIG. 7 is a circuit diagram showing a conventional ACT type flash memory array structure.
Figure 8:
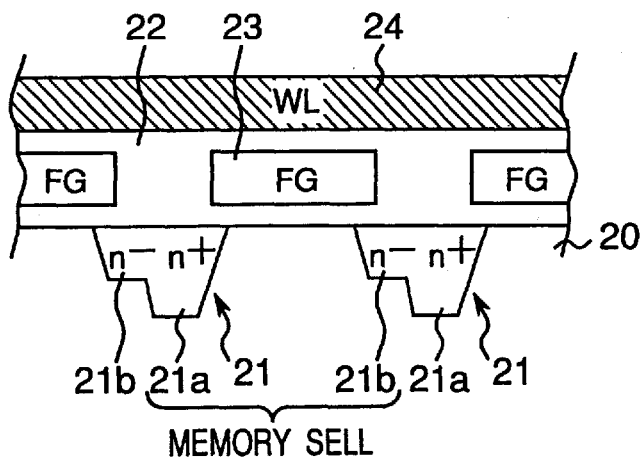
FIG. 8 is a sectional view of an essential part of the ACT type flash memory of FIG. 7.
Figure 9:
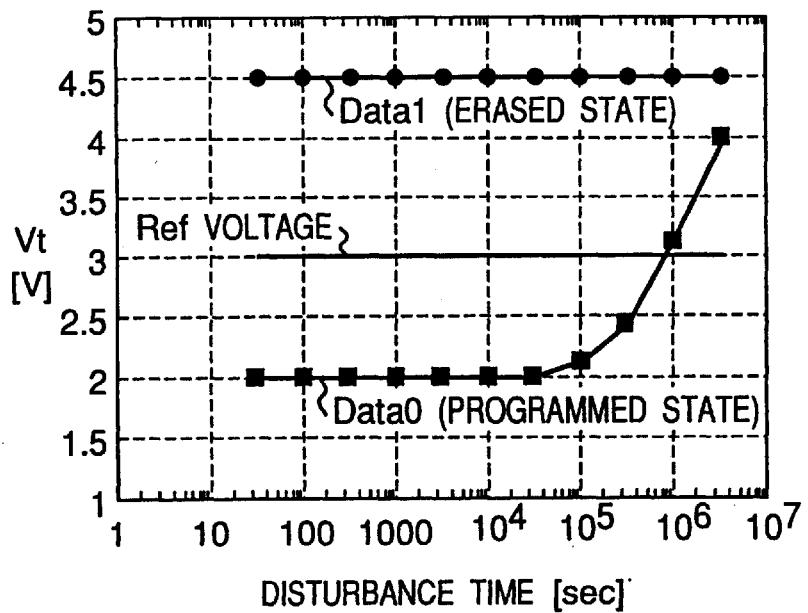
FIG. 9 is a graph showing the disturbance characteristics of the ACT type flash memory of FIG. 7.

FIG. 5 is a circuit diagram showing a DuSNOR type flash memory array structure using the nonvolatile semiconductor storage device erasing method of the third embodiment of the present invention.

As shown in FIG. 5, in this DuSNOR type flash memory, memory cells M00, M01, . . . , M10, M11, . . . each being constructed of a floating gate type field-effect transistor capable of electrically writing and erasing information are arranged in a matrix form, and word lines WL0 through WL31 and WL32 through WL63 are connected to the control gates of the memory cells of an identical row. The memory cells M00, M01, . . . whose control gates are connected to the word lines WL0 through WL31 belong to a BLOCK0, and the memory cells M10, M11, . . . whose control gates are connected to the word lines WL32 through WL63 belong to a BLOCK1.

In the memory cells M00, M01, . . . of the BLOCK0, the sub-bit lines SBL00 through SBL04095 are connected to the drains of the memory cells of an identical column, while the source lines SL00 through SL04094 are jointly connected to the sources of adjoining memory cells of an identical column. Main bit lines BL0 through BL4095 are connected to the sub-bit lines SBL00 through SBL04095 via selection transistors ST00A through ST04095A. A selection gate signal line DSG0 is connected to the gates of the selection transistors ST00A through ST04095A. A common source line SL is connected to the source lines SL00 through SL04094 via selection transistors ST00B through ST04094B, while a selection gate signal line SSG0 is connected to the gates of the selection transistors ST00B through ST04094B.

In the memory cells M10, M11, . . . of the BLOCK1, sub-bit lines SBL10 through SBL14095 are connected to the drains of the memory cells of an identical column, while the source lines SL10 through SL14094 are jointly connected to the sources of adjoining memory cells of an identical column. The main bit lines BL0 through BL4095 are connected to the sub-bit lines SBL10 through SBL14095 via selection transistors ST10A through ST14095A, while the selection gate signal line DSG1 is connected to the gates of the selection transistors ST10A through ST14095A. The common source line SL is connected to the source lines SL10 through SL14094 via selection transistors ST10B through ST14094B, while a selection gate signal line SSG1 is connected to the gates of the selection transistors ST10B through ST14094B.

In the case where the BLOCK0 is first subjected to erasing in the DuSNOR type flash memory having the aforementioned construction, the semiconductor substrate (well) voltage is set to the first negative voltage Vneg (−8 V, for example), and a voltage Vpp (+10 V, for example) is applied to the word lines WL0 through WL31. The negative voltage Vneg (−8 V, for example) is applied to the common source line SL, and a voltage of 0 V is applied to the selection gate signal line SSG0. Then, the selection transistors ST00B through ST14094B whose gates are connected to the selection gate signal line SSG0 are turned on, and the negative voltage Vneg (−8 V, for example) is outputted to the source formed from the diffusion layer. On the other hand, a disturbance preventing voltage Vnv (−4 V, for example) that serves as a second negative voltage is applied to the main bit lines BL0, BL1, . . . , BL4095. However, the selection gate signal line DSG0 is the negative voltage Vneg (−8 V, for example). Therefore, the selection transistors ST00A through ST04095A whose gates are connected to the selection gate signal line DSG0 are off, and the sub-bit lines SBL00, SBL01, . . . , SBL04095 formed from the diffusion layer are brought into the floating state. Therefore, for example, the voltage Vpp (+10 V, for example) applied to the control gate of the memory cell M00 and the voltage of −8 V applied to the semiconductor substrate (well) and the source form a channel layer in the memory cell M00, and the channel layer comes to have a voltage of −8 V. Consequently, a high electric field is generated between the floating gate and the channel, and electrons are injected into the floating gate, increasing the threshold voltage of the memory cell M00. Likewise, the threshold voltage of all the memory cells inside the BLOCK0 is increased (threshold voltage of not lower than 4 V, for example), and the erasing ends.

On the other hand, in the unselected block BLOCK1, the reference voltage Vss (0 V, for example) is applied to the word lines WL32 through WL63. Then, the negative voltage Vneg (−8 V, for example) is applied to the selection gate signal line SSG1. Therefore, the selection transistors ST10B through ST14094B whose gates are connected to the selection gate signal line SSG1 are turned off, and the source lines SL10 through SL14094 formed from the diffusion layer are brought into the floating state. On the other hand, the reference voltage Vss (0 V, for example) is applied to the selection gate signal line DSG1. Therefore, the selection transistors ST10A through ST14095A whose gates are connected to the selection gate signal line DSG1 are turned on, and the disturbance preventing voltage Vnv (−4 V, for example) is outputted to the sub-bit lines SBL10, SBL11, . . . , SBL14095 formed from the diffusion layer. Then, in the case where the threshold voltage of the memory cell M10 is low (not higher than 2 V, for example), the control gate comes to have the reference voltage Vss (0 V, for example), and the sub-bit lines SBL10, SBL11, . . . , SBL14095 come to have the voltage Vnv (−4 V, for example). Consequently, the semiconductor substrate (well) voltage becomes the negative voltage Vneg (−8 V, for example). Therefore, the memory cell M10 is turned on, and the channel layer formed in the memory cell M10 comes to have the voltage Vnv (−4 V, for example). In this case, the control gate voltage becomes 0 V and the channel layer comes to have a voltage of −4 V similarly to the second embodiment, by which the electric field between the floating gate and the channel is alleviated further than in the conventional case, exhibiting the characteristics shown in FIG. 4.

As a result, the threshold voltage varies a little even in the memory cell of data "0" in the low threshold voltage state even after a lapse of $10^6$ seconds of the disturbance time in the 64-M flash memory, and the threshold voltage becomes sufficiently lower than the Ref voltage of the sensing circuit. Therefore, the threshold voltage of the memory cell of the data "0" has a sufficient margin with respect to the Ref voltage of the sensing circuit, and accordingly, the data "0" can be read even after the influence of the substrate disturbance exerted.

Fourth Embodiment

Figure 10:
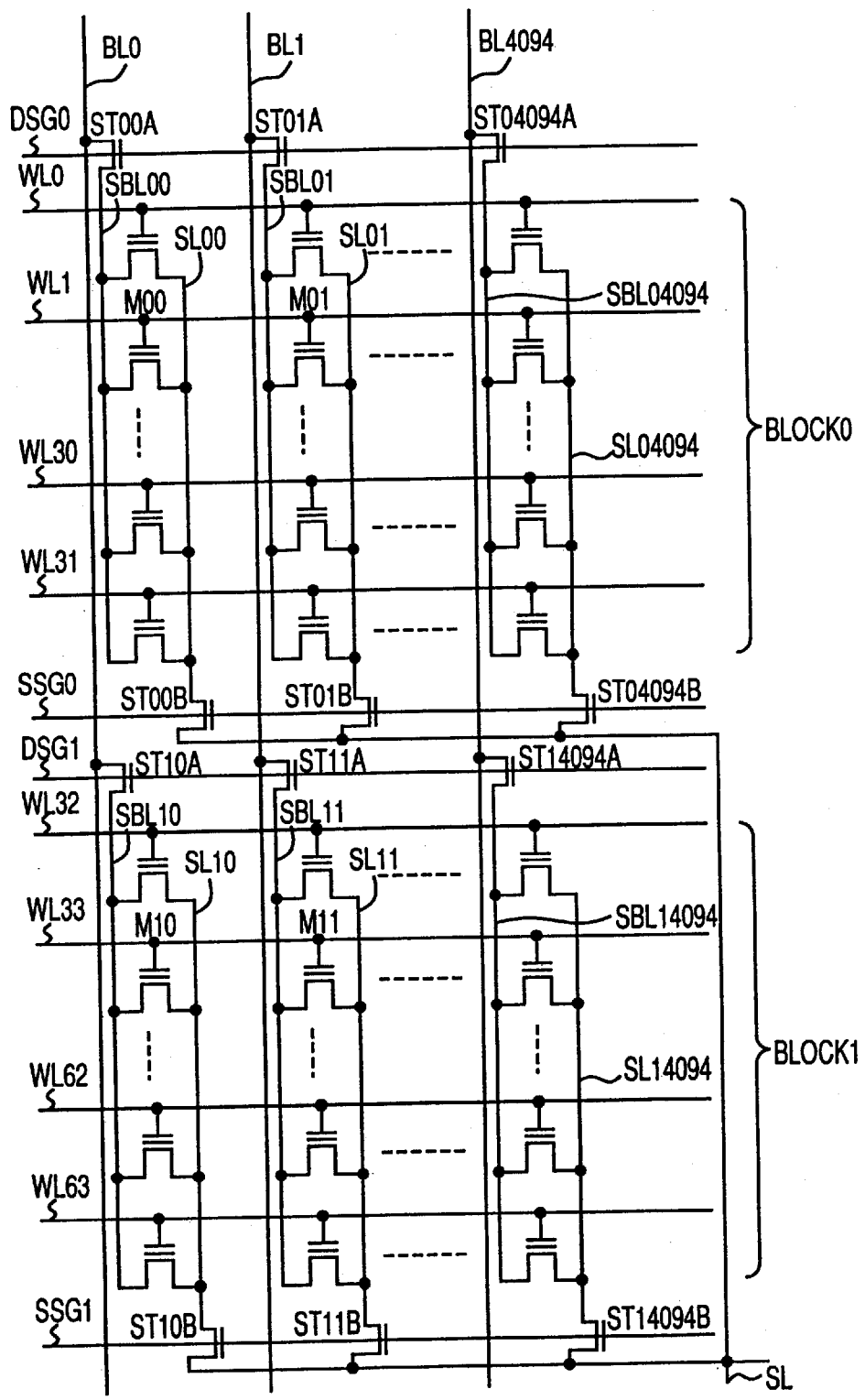
FIG. 10 is a circuit diagram showing a conventional AND type flash memory array structure.

An AND type flash memory employing the nonvolatile semiconductor storage device erasing method of the fourth embodiment of the present invention will be described next. It is to be noted that this AND type flash memory array structure has the same structure as that of the AND type flash memory shown in FIG. 10. Therefore, no description is provided for the similar components, and reference should be made to FIG. 10.

In the case where the BLOCK0 is subjected to erasing in the aforementioned AND type flash memory, the semiconductor substrate (well) voltage is set to the first negative voltage Vneg (−8 V, for example), and a voltage Vpp (+10 V, for example) is applied to the word lines WL0 through WL31. A negative voltage Vneg (−8 V, for example) is applied to the common source SL, and a voltage of 0 V is applied to the selection gate signal line SSG0. The selection transistors ST00B through ST04094B whose gates are connected to the selection gate signal line SSG0 are turned on, and the negative voltage Vneg (−8 V, for example) is outputted to the source formed from the diffusion layer. On the other hand, a disturbance preventing voltage Vnv (−4 V, for example) that serves as a second negative voltage is applied to the main bit lines BL0, BL1, . . . , BL4094. In this stage, the selection gate signal line DSG0 has the negative voltage Vneg (−8 V, for example). Therefore, the selection transistors ST00A through ST04094A whose gates are connected to the selection gate signal line DSG0 are turned off, and the sub-bit lines SBL00, SBL01, . . . , SBL04094 formed from the diffusion layer are brought into the floating state. If, for example, the voltage Vpp (+10 V, for example) is applied to the gate of the memory cell M00 and a voltage of −8 V is applied to the semiconductor substrate (well), then the memory cell M00 is turned on and the channel layer formed in the memory cell M00 comes to have a voltage of −8 V. Consequently, a high electric field is generated between the floating gate and the channel layer, and electrons are injected into the floating gate, increasing the threshold voltage of the memory cell M00. Likewise, the threshold voltage of all the memory cells M00, M01, . . . inside the BLOCK0 is increased (not lower than 4 V, for example), and the erasing ends.

On the other hand, in the unselected block BLOCK1, the word lines WL32 through WL63 come to have the reference voltage Vss (0 V, for example). The negative voltage Vneg (−8 V, for example) is applied to the selection gate signal line SSG1. Therefore, the selection transistors ST10B through ST14094B whose gates are connected to the selection gate signal line SSG1 are turned off, and the source lines SL10 through SL14094 formed from a diffusion layer are brought into the floating state. On the other hand, the reference voltage Vss (0 V, for example) is applied to the selection gate signal line DSG1, and therefore, the selection transistors ST10A through ST14094A whose gates are connected to the selection signal gate line DSG1 are turned on. Consequently, a disturbance preventing voltage Vnv (−4 V, for example) is outputted to the sub-bit lines SBL10, SBL11, . . . , SBL14095 formed from the diffusion layer. If the threshold voltage of the memory cell M10 is low (not higher than 2 V, for example), then the control gate voltage comes to have the reference voltage Vss (0 V, for example), and the sub-bit line comes to have the voltage Vnv (−4 V, for example). The semiconductor substrate (well) voltage becomes the negative voltage Vneg (−8 V, for example). Consequently, the memory cell M10 is turned on and the channel layer formed in the memory cell M10 comes to have the voltage Vnv (−4 V, for example). In this case, the electric field between the floating gate and the channel is alleviated further than in the conventional case similarly to the second embodiment, exhibiting the characteristics shown in FIG. 4.

As a result, the threshold voltage varies a little even in the memory cell of data "0" in the low threshold voltage state even after a lapse of $10^6$ seconds of the disturbance time in the 64-M flash memory, and the threshold voltage is sufficiently lower than the Ref voltage of the sensing circuit. Therefore, the threshold voltage of the memory cell of the data "0" has a sufficient margin with respect to the Ref voltage of the sensing circuit, and accordingly, the data "0" can be read even after the influence of the substrate disturbance exerted.

It is to be noted that the nonvolatile semiconductor storage device erasing method of the present invention is limited to neither one of the aforementioned, first through fourth embodiments and is, of course, able to be subjected to a number of modifications within the scope not departing from the essence thereof. For example, the values of the concrete voltages used for writing, erasing and so on are limited to neither one of the aforementioned first through fourth embodiments and are able to be subjected to appropriate modifications according to the circuit construction and the like.

The nonvolatile semiconductor storage device erasing method of the present invention is not limited to the flash memory and is able to be applied to a nonvolatile semiconductor storage device capable of electrical writing and erasing.

The invention being thus described, it will be obvious that the same may be varied in many ways. Such variations are not be regarded as a departure from the spirit and scope of the invention, and all such modifications as would be obvious to one skilled in the art are intended to be included within the scope of the following claims.

What is claimed is:

1. A method for erasing a nonvolatile semiconductor storage device, said device comprising:
   a memory cell array divided into blocks in each of which memory cells are arranged in a matrix form on a semiconductor substrate, each of the memory cells being comprised of a floating gate type field-effect transistor that has a control gate, a drain and a source and is able to electrically be programmed and erased by using a Fowler-Nordheim tunneling phenomenon;
   word lines each connected to control gates of the memory cells arranged in an identical row;
   sub-bit lines each connected to the drains or the sources of the memory cells arranged in an identical column; and main bit lines each connected to an associated sub-bit line so as to form a layered structure together with the associated sub-bit line, wherein:

in an erase operation of a selected block of the memory cell array, a first negative voltage is applied to the semiconductor substrate, a first positive voltage is applied to the word lines of an unselected block of the memory cell array, and a reference voltage is applied to the sub-bit lines of the unselected block so that memory cells in a low threshold voltage state within the unselected block are turned on, and that a channel layer formed in each of the memory cells which have been turned on comes to have the reference voltage.

2. The method as set forth in claim 1, wherein the first positive voltage is higher than a threshold voltage at which the memory cells in the low threshold voltage state are turned on.

3. A method for erasing a nonvolatile semiconductor storage device, said device comprising:

a memory cell array divided into blocks in each of which memory cells are arranged in a matrix form on a semiconductor substrate, each of the memory cells being comprised of a floating gate type field-effect transistor that has a control gate, a drain and a source and is able to electrically be programmed and erased by using a Fowler-Nordheim tunneling phenomenon;

word lines each connected to control gates of the memory cells arranged in an identical row;

sub-bit lines each connected to the drains or the sources of the memory cells arranged in an identical column; and main bit lines each connected to an associated sub-bit line so as to form a layered structure together with the associated sub-bit line, wherein:

in an erase operation of a selected block of the memory cell array, a first negative voltage is applied to the semiconductor substrate, a reference voltage is applied to the word lines of an unselected block of the memory cell array, and a second negative voltage is applied to the sub-bit lines of the unselected block so that memory cells in a low threshold voltage state within the unselected block are turned on, and that a channel layer formed in each of the memory cells which have been turned on comes to have the second negative voltage.

4. The method as set forth in claim 3, wherein an absolute value of the second negative voltage is smaller than an absolute value of the first negative voltage.

5. A method for erasing a nonvolatile semiconductor storage device, said device comprising:

a memory cell array divided into blocks in each of which memory cells are arranged in a matrix form on a semiconductor substrate, each of the memory cells being comprised of a floating gate type field-effect transistor that has a control gate, a drain and a source and is able to electrically be programmed and erased by using a Fowler-Nordheim tunneling phenomenon;

word lines each connected to control gates of the memory cells arranged in an identical row;

sub-bit lines each connected to the drains or the sources of the memory cells arranged in an identical column; and main bit lines each connected to an associated sub-bit line so as to form a layered structure together with the associated sub-bit line, wherein:

adjoining memory cells jointly own an identical sub-bit line, in an erase operation of a selected block of the memory cell array, a first negative voltage is applied to the semiconductor substrate, a first positive voltage is applied to the word lines of an unselected block of the memory cell array, and a reference voltage is applied to the sub-bit lines of the unselected block so that memory cells in a low threshold voltage state within the unselected block are turned on, and that a channel layer formed in each of the memory cells which have been turned on comes to have the reference voltage.

6. The method as set forth in claim 5, wherein the first positive voltage is higher than a threshold voltage at which the memory cells in the low threshold voltage state are turned on.

7. The method as set forth in claim 5, wherein the first negative voltage is applied to either one of an even-number main bit line and an odd-number main bit line of the main bit lines, and the reference voltage is applied to the other one of the even-number main bit line and the odd-number main bit line of the main bit lines.

8. A method for erasing a nonvolatile semiconductor storage device, said device comprising:

a memory cell array divided into blocks in each of which memory cells are arranged in a matrix form on a semiconductor substrate, each of the memory cells being comprised of a floating gate type field-effect transistor that has a control gate, a drain and a source and is able to electrically be programmed and erased by using a Fowler-Nordheim tunneling phenomenon;

word lines each connected to control gates of the memory cells arranged in an identical row;

sub-bit lines each connected to the drains or the sources of the memory cells arranged in an identical column; and main bit lines each connected to an associated sub-bit line so as to form a layered structure together with the associated sub-bit line, wherein:

adjoining memory cells jointly own an identical sub-bit line, in an erase operation of a selected block of the memory cell array, a first negative voltage is applied to the semiconductor substrate, a reference voltage is applied to the word lines of an unselected block of the memory cell array, and a second negative voltage is applied to the sub-bit lines of the unselected block so that memory cells in a low threshold voltage state within the unselected block are turned on, and that a channel layer formed in each of the memory cells which have been turned on comes to have the second negative voltage.

9. The method as set forth in claim 8, wherein an absolute value of the second negative voltage is smaller than an absolute value of the first negative voltage.

10. The method as set forth in claim 8, wherein the first negative voltage is applied to either one of an even-number main bit line and an odd-number main bit line of the main bit lines, and the second negative voltage is applied to the other one of the even-number main bit line and the odd-number main bit line of the main bit lines.

* * * * *